United States Patent
Kishi et al.

(10) Patent No.: US 11,205,557 B2
(45) Date of Patent: Dec. 21, 2021

(54) MULTI CHARGED PARTICLE BEAM WRITING APPARATUS

(71) Applicant: NuFlare Technology, Inc., Yokohama (JP)

(72) Inventors: Kazuhiro Kishi, Yokohama (JP); Mitsuhiro Okazawa, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/841,737

(22) Filed: Apr. 7, 2020

(65) Prior Publication Data
US 2020/0335297 A1    Oct. 22, 2020

(30) Foreign Application Priority Data

Apr. 19, 2019   (JP) .............................. JP2019-079733

(51) Int. Cl.
*H01J 37/09*     (2006.01)
*H01J 37/31*     (2006.01)
(Continued)

(52) U.S. Cl.
CPC ............ *H01J 37/09* (2013.01); *H01J 37/244* (2013.01); *H01J 37/3177* (2013.01);
(Continued)

(58) Field of Classification Search
CPC ...... H01J 37/09; H01J 37/244; H01J 37/3177; H01J 2237/024; H01J 2237/026; H01J 2237/0453; H01J 2237/24564
(Continued)

(56) References Cited

U.S. PATENT DOCUMENTS

| | | | |
|---|---|---|---|
| 8,546,767 B2 | 10/2013 | Platzgummer et al. | |
| 2020/0203121 A1* | 6/2020 | Ogasawara | ......... H01J 37/3177 |
| 2020/0343073 A1* | 10/2020 | Okazawa | .............. H01J 37/045 |

FOREIGN PATENT DOCUMENTS

| | | |
|---|---|---|
| JP | 2004-165252 A | 6/2004 |
| JP | 2013-128031 A | 6/2013 |

OTHER PUBLICATIONS

Combined Taiwanese Office Action and Search Report dated Apr. 7, 2021 in Taiwanese Patent Application No. 109105827 (with unedited computer generated English translation), 8 pages.
(Continued)

*Primary Examiner* — Nicole M Ippolito
(74) *Attorney, Agent, or Firm* — Oblon, McClelland, Maier & Neustadt, L.L.P.

(57) ABSTRACT

Provided is a multi charged particle beam writing apparatus, including: an emission unit emitting a charged particle beam; a first aperture substrate having a plurality of first openings, the first aperture being irradiated with the charged particle beam, and the first aperture allowing a portion of the charged particle beam to pass through the plurality of first openings to form multiple beams; a second aperture substrate having a plurality of second openings through which each beam of the multiple beams passes and the second aperture substrate being capable of independently deflecting the each beam of the multiple beams; and a shielding plate provided so as to be insertable to a space between the first aperture substrate and the second aperture substrate and the shielding plate being capable of simultaneously shielding all the multiple beams.

11 Claims, 5 Drawing Sheets

(51) Int. Cl.
*H01J 37/24* (2006.01)
*H01J 37/317* (2006.01)
*H01J 37/244* (2006.01)

(52) U.S. Cl.
CPC ... *H01J 2237/024* (2013.01); *H01J 2237/026* (2013.01); *H01J 2237/0453* (2013.01); *H01J 2237/24564* (2013.01)

(58) Field of Classification Search
USPC ... 250/492.1, 492.2, 492.21, 492.22, 492.23, 250/492.3
See application file for complete search history.

(56) References Cited

OTHER PUBLICATIONS

Korean Office Action dated Oct. 19, 2021 in Korean Application No. 10-2020-0030641, with English machine translation, 8 pgs.

\* cited by examiner

MULTI CHARGED PARTICLE BEAM WRITING APPARATUS

CROSS-REFERENCE TO RELATED APPLICATION

This application is based upon and claims the benefit of priority from Japanese Patent Applications No. 2019-079733, filed on Apr. 19, 2019, the entire contents of which are incorporated herein by reference.

FIELD OF THE INVENTION

Embodiments relate to a multi charged particle beam writing apparatus.

BACKGROUND OF THE INVENTION

With high integration of semiconductor devices, circuit patterns of semiconductor devices have become fine. In realizing a fine circuit pattern, a lithography technique for forming a circuit pattern on a semiconductor substrate becomes important. In order to form a fine circuit pattern by using a lithography technique, an original image pattern (also referred to as a reticle or a mask) with high accuracy is required. Electron beam writing inherently has excellent resolution, and thus, is used for manufacturing an original image pattern with high accuracy.

For example, there is a writing apparatus using multiple beams. Compared to pattern drawing with single electron beam, the target object can be irradiated with many electron beams at once by using the multiple beams. Therefore, it is possible to greatly improve the throughput of the pattern drawing.

In a writing apparatus using multiple beams, the multiple beams are formed by allowing an electron beam emitted from an electron gun assembly to pass through a shaping aperture array substrate having a plurality of openings. Each beam of the multiple beams is independently deflected by a blanking aperture array substrate.

The blanking aperture array substrate has a plurality of openings through which each of the multiple beams passes, an electrode pair provided in each of the openings, and an electronic circuit for controlling a voltage applied to the electrode pair. By controlling the voltage applied to the electrode pair, each beam of the multiple beams is deflected. The beam deflected by the electrode pair is shielded, and the target object is irradiated with the beam that is not deflected, so that the pattern drawing is performed.

The temperature of the shaping aperture array substrate rises due to the irradiation with the electron beam. If the temperature of the shaping aperture array substrate rises, the pitch of the openings changes due to thermal expansion. For this reason, for example, the pitch of the openings of the shaping aperture array substrate is designed in consideration of a change due to arise in temperature of the shaping aperture array substrate in advance. That is, the pitch of the openings is designed so that each beam of the multiple beams passes through each of the openings of the blanking aperture array substrate at the time point when the pitch of the openings is stabilized due to the thermal expansion of the shaping aperture array substrate.

Therefore, there is a concern that, until the pitch of the openings of the shaping aperture array substrate is stabilized, the electronic circuit of the blanking aperture array substrate is irradiated with the electron beam. If the electronic circuit is irradiated with the electron beam, there is a concern that the electronic circuit fails.

SUMMARY OF THE INVENTION

According to an aspect of the embodiment, there is provided a multi charged particle beam writing apparatus including: an emission unit emitting a charged particle beam; a first aperture substrate having a plurality of first openings, the first aperture being irradiated with the charged particle beam, and the first aperture allowing a portion of the charged particle beam to pass through the plurality of first openings to form multiple beams; a second aperture substrate having a plurality of second openings through which each beam of the multiple beams passes and the second aperture substrate being capable of independently deflecting the each beam of the multiple beams; and a shielding plate provided so as to be insertable to a space between the first aperture substrate and the second aperture substrate and the shielding plate being capable of simultaneously shielding all the multiple beams.

DETAILED DESCRIPTION OF THE EMBODIMENTS

Hereinafter, embodiments will be described with reference to the drawings. Hereinafter, in the embodiments, a configuration using an electron beam will be described as an example of a charged particle beam. However, the charged particle beam is not limited to an electron beam, but a beam using charged particles such as an ion beam may be used.

In this specification, the pattern drawing data is basic data of the pattern to be drawn on the target object. The pattern drawing data is data obtained by converting a format of design data generated by a designer by CAD or the like so that arithmetic processing can be performed in the writing apparatus. A drawing pattern of a figure or the like is defined by, for example, coordinates such as vertices of the figure.

First Embodiment

A multi charged particle beam writing apparatus according to a first embodiment includes: an emission unit for emitting a charged particle beam; a first aperture substrate having a plurality of first openings, being irradiated with the charged particle beam, and allowing a portion of the charged particle beam to pass through the plurality of first openings to form multiple beams; a second aperture substrate having a plurality of second openings through which each beam of the multiple beams passes and being capable of independently deflecting each beam of the multiple beams; and a shielding plate provided so as to be insertable between the first aperture substrate and the second aperture substrate and capable of simultaneously shielding all the multiple beams.

Hereinafter, a case where the multi charged particle beam writing apparatus is a mask writing apparatus will be described as an example.

Figure 1:
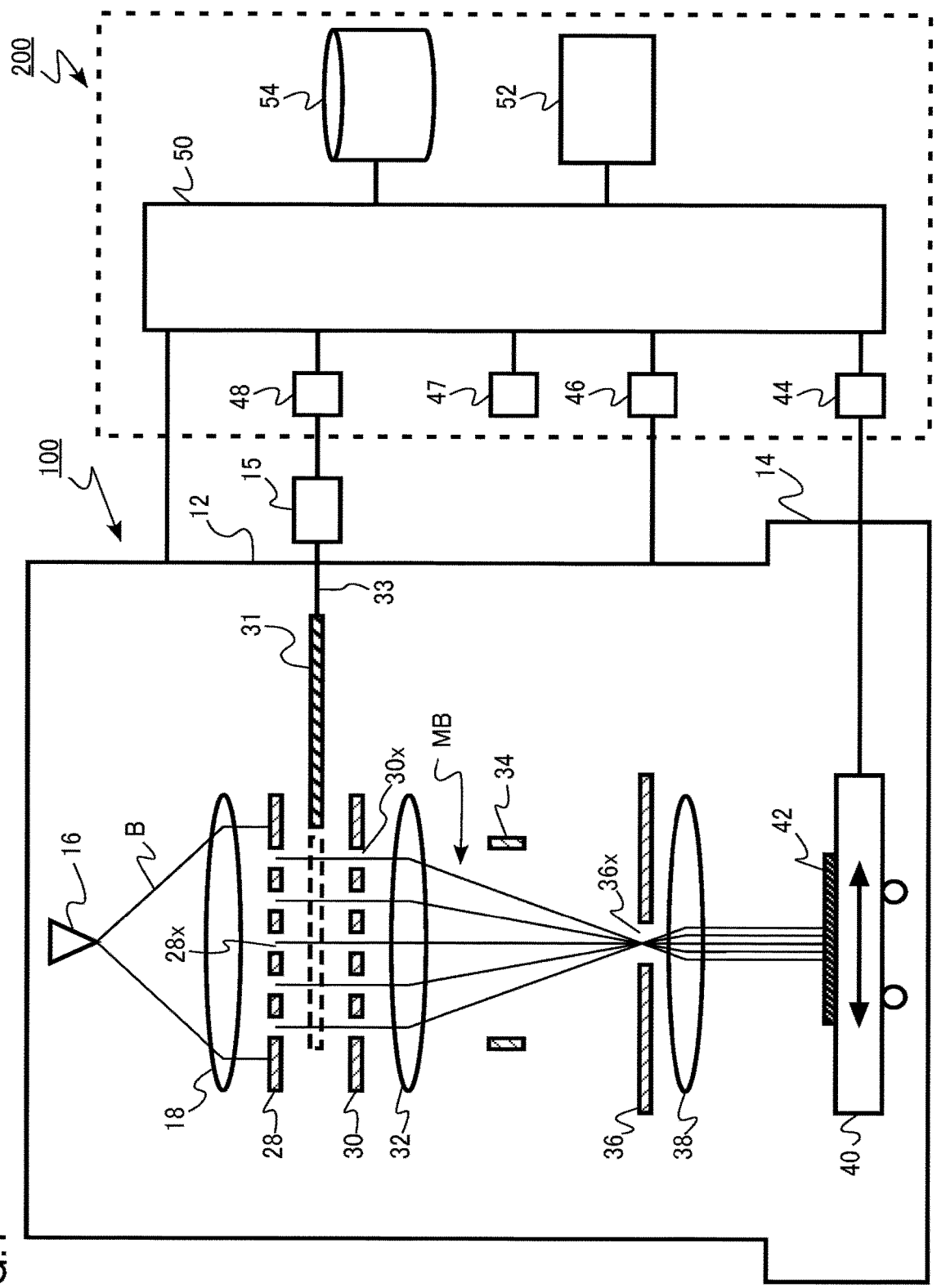
FIG. 1 is a conceptual view illustrating a configuration of a multi charged particle beam writing apparatus according to a first embodiment.

FIG. 1 is a conceptual view illustrating a configuration of the multi charged particle beam writing apparatus according to the first embodiment.

As illustrated in FIG. 1, a mask writing apparatus (charged particle beam writing apparatus) includes a pattern drawing unit 100 and a control unit 200. The mask writing apparatus draws a desired pattern on a target object 42.

The pattern drawing unit 100 includes an electron lens barrel 12, a pattern drawing chamber 14, and a driving motor 15 (driving unit). An electron gun assembly 16 (emission unit), an illumination lens 18, a shaping aperture array substrate 28 (first aperture substrate), a blanking aperture array substrate 30 (second aperture substrate), a shielding plate 31, a projection lens 32, a support portion 33, a deflector 34, a stopping aperture 36, and an objective lens 38 are arranged in the electron lens barrel 12. The pattern drawing unit 100 performs pattern drawing on the target object 42.

An XY stage 40 movably arranged is arranged in the pattern drawing chamber 14. The target object (pattern drawing target object) 42 can be mounted on the XY stage 40. The target object 42 is a mask substrate for exposure for transferring a pattern to a wafer. The mask substrate is, for example, a mask blank on which nothing is drawn yet.

The inside of the electron lens barrel 12 and the inside of the pattern drawing chamber 14 are evacuated by a vacuum pump (not illustrated) to have a pressure lower than the atmospheric pressure.

The control unit 200 includes a stage driving circuit 44, a deflection control circuit 46, a determination circuit 47, a shielding plate driving circuit 48, a control calculator 50, a memory 52, and a magnetic disk drive 54. The control unit 200 controls the pattern drawing unit 100 that performs pattern drawing on the target object 42.

The electron gun assembly 16 emits an electron beam B. The electron gun assembly 16 is an example of an emission unit.

The illumination lens 18 is provided on the XY stage 40 side of the electron gun assembly 16. The illumination lens 18 refracts the electron beam B emitted from the electron gun assembly 16 and irradiates the shaping aperture array substrate 28 with the electron beam B almost vertically. The illumination lens 18 is an electron lens.

The shaping aperture array substrate 28 is provided on the XY stage 40 side of the illumination lens 18. The shaping aperture array substrate 28 is provided between the illumination lens 18 and the blanking aperture array substrate 30. The shaping aperture array substrate 28 is irradiated with the electron beam B. The shaping aperture array substrate 28 forms multiple beams MB.

The blanking aperture array substrate 30 is provided on the XY stage 40 side of the shaping aperture array substrate 28. Each beam of the multiple beams MB can be independently deflected by the blanking aperture array substrate 30.

The shielding plate 31 is provided so as to be insertable between the shaping aperture array substrate 28 and the blanking aperture array substrate 30. The shielding plate 31 can simultaneously shield all the multiple beams MB.

Figure 2A:
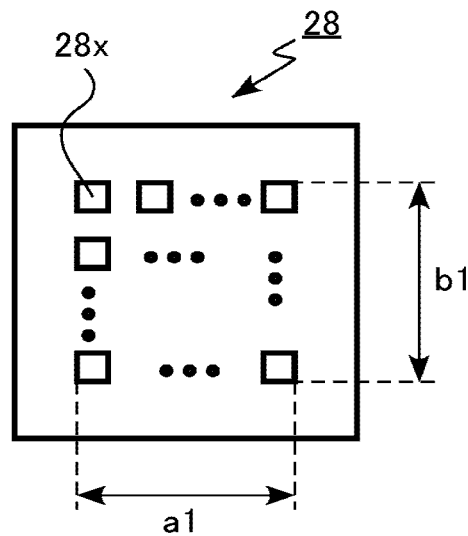
FIGS. 2A, 2B, and 2C are schematic top views of a shaping aperture array substrate, a blanking aperture array substrate, and a shielding plate according to the first embodiment.
Figure 2B:
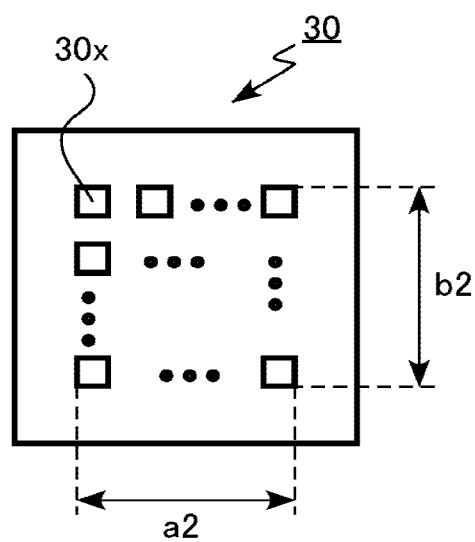
Figure 2C:
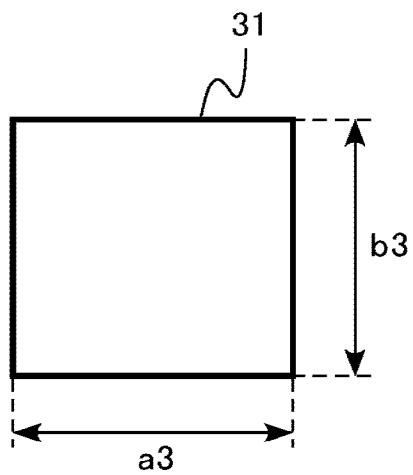

FIGS. 2A, 2B, and 2C are schematic top views of the shaping aperture array substrate, the blanking aperture array substrate, and the shielding plate of the first embodiment. FIG. 2A illustrates the shaping aperture array substrate, FIG. 2B illustrates the blanking aperture array substrate, and FIG. 2C illustrates the shielding plate.

As illustrated in FIG. 2A, the shaping aperture array substrate 28 has a plate shape. The shaping aperture array substrate 28 has a plurality of first openings 28x. In the shaping aperture array substrate 28, for example, m columns x n rows (m, n≥2) of the first openings 28x are arranged at a predetermined pitch. The plurality of first openings 28x constitute a first aperture array.

The first opening 28x has, for example, a rectangular shape. The first opening 28x has, for example, a square shape. The first opening 28x may have, for example, a circular shape. The first openings 28x of the shaping aperture array substrate 28 are formed by using, for example, a semiconductor process.

A portion of the electron beam B emitted from the electron gun assembly 16 passes through the plurality of first openings 28x of the shaping aperture array substrate 28 to be divided, so that the multiple beams MB are formed.

The material of the shaping aperture array substrate 28 is, for example, silicon (Si).

As illustrated in FIG. 2B, the blanking aperture array substrate 30 has a plate shape. The blanking aperture array substrate 30 has a plurality of second openings 30x through which each beam of the multiple beams MB formed by the shaping aperture array substrate 28 passes. In the blanking aperture array substrate 30, for example, m columns x n rows (m, n≥2) of the second openings 30x are arranged at a predetermined pitch. The plurality of second openings 30x constitute a second aperture array.

The number of the first openings 28x of the shaping aperture array substrate 28 and the number of the second openings 30x of the blanking aperture array substrate 30 are equal to each other. For example, the pitch of the arrangement of the first openings 28x and the pitch of the arrangement of the second openings 30x are equal to each other.

A blanker (not illustrated) is provided in each of the second openings 30x. The blanker is formed by a pair of electrodes. An electronic circuit (not illustrated) is formed in the blanking aperture array substrate 30. The electronic circuit controls a voltage applied to the blanker.

For example, one electrode of the blanker is fixed to the ground potential, and a potential different from the ground potential is applied to the other electrode. Each beam of the multiple beams MB passing through the second opening 30x is independently deflected by the voltage applied to the blanker.

The material of the blanking aperture array substrate 30 is, for example, silicon (Si). The second opening 30x, the blanker, and the electronic circuit are formed, for example, on a silicon substrate by using a semiconductor process.

As illustrated in FIG. 2C, the shielding plate 31 has a plate shape. The thickness of the shielding plate 31 is, for example, 0.5 mm or more and 5 mm or less.

The shielding plate 31 contains, for example, a metal. As a material of the shielding plate 31, for example, a metal is used.

The metal that is the material of the shielding plate 31 is, for example, a heavy metal. The heavy metal is, for example, tantalum (Ta), tungsten (W), gold (Au), or lead (Pb). In addition, the heavy metal denotes a metal having a specific gravity equal to or higher than that of iron (Fe).

The metal contained in the shielding plate 31 is, for example, a non-magnetic metal.

As a material of the shielding plate 31, for example, a light metal such as aluminum (1) or titanium (Ti) can be used. As a material of the shielding plate 31, for example, carbon (C) or silicon (Si) can be used.

As illustrated in FIGS. 2A and 2C, a horizontal width a3 and a vertical width b3 of the shielding plate 31 are larger than a horizontal width a1 and a vertical width b1 of the first aperture array of the shaping aperture array substrate 28, respectively. In addition, as illustrated in FIGS. 2B and 2C, the horizontal width a3 and the vertical width b3 of the shielding plate 31 are larger than a horizontal width a2 and a vertical width b2 of the second aperture array of the blanking aperture array substrate 30, respectively.

The support portion 33 supports the shielding plate 31. The support portion 33 penetrates the electron lens barrel 12.

The driving motor 15 is provided outside the electron lens barrel 12. The driving motor 15 is connected to the support portion 33. The driving motor 15 performs the insertion and the extraction of the shielding plate 31 between the shaping aperture array substrate 28 and the blanking aperture array substrate 30, for example, by moving the support portion 33 in the horizontal direction. The driving motor 15 performs the insertion and the extraction of the shielding plate 31 to and from the space between the shaping aperture array substrate 28 and the blanking aperture array substrate 30. The driving motor 15 may be provided inside the electron lens barrel 12.

The projection lens 32 is provided on the XY stage 40 side of the blanking aperture array substrate 30. The projection lens 32 converges the multiple beams MB that has passed through the blanking aperture array substrate 30. The projection lens 32 is an electron lens.

The deflector 34 is provided on the XY stage 40 side of the projection lens 32. The deflector 34 deflects the multiple beams MB converged by the projection lens 32 collectively in the same direction.

The stopping aperture 36 is provided on the XY stage 40 side of the deflector 34. The stopping aperture 36 shields the electron beam deflected by the blanker of the blanking aperture array substrate 30 among the multiple beams MB.

The stopping aperture 36 has a plate shape. The stopping aperture 36 has a third opening 36x. Among the multiple beams MB, the electron beam not deflected by the blanker of the blanking aperture array substrate 30 passes through the third opening 36x.

In addition, the deflector 34 can be provided on the XY stage 40 side of the stopping aperture 36.

The objective lens 38 is provided on the XY stage 40 side of the stopping aperture 36. The objective lens 38 focuses each beam that has passed through the stopping aperture 36 on the target object 42.

The stage driving circuit 44 controls the movement of the XY stage 40 in the pattern drawing chamber 14. The deflection control circuit 46 controls the deflection of the multiple beams MB by the blanking aperture array substrate 30 and the deflector 34.

The shielding plate driving circuit 48 controls the movement of the shielding plate 31 by the driving motor 15. The shielding plate driving circuit 48 controls the insertion and the extraction of the shielding plate 31 between the shaping aperture array substrate 28 and the blanking aperture array substrate 30. In addition, the movement of the shielding plate 31 may be manually controlled.

The determination circuit 47 determines the insertion and the extraction of the shielding plate 31 between the shaping aperture array substrate 28 and the blanking aperture array substrate 30. The determination circuit 47 determines an appropriate timing for inserting the shielding plate 31 and an appropriate timing for extracting the shielding plate 31 between the shaping aperture array substrate 28 and the blanking aperture array substrate 30. The timing may be set manually without using the circuit.

The magnetic disk drive 54 stores, for example, pattern drawing data. The pattern drawing data is input from the magnetic disk drive 54 to the control calculator 50.

The memory 52 stores, for example, information input to the control calculator 50, information during arithmetic processing, and information after arithmetic processing.

The control calculator 50 is connected to the stage driving circuit 44, the deflection control circuit 46, the determination circuit 47, and the shielding plate driving circuit 48. The stage driving circuit 44, the deflection control circuit 46, the determination circuit 47, and the shielding plate driving circuit 48 are controlled by the control calculator 50. A command signal is transmitted from the control calculator 50 to the stage driving circuit 44, the deflection control circuit 46, the determination circuit 47, the shielding plate driving circuit 48, and the like, and pattern drawing is performed.

FIG. 1 illustrates components necessary for describing the first embodiment. It goes without saying that the mask writing apparatus according to the first embodiment usually includes other components necessary for the mask writing apparatus.

Next, the operations of the multi charged particle beam writing apparatus according to the first embodiment will be described.

Figure 3A:
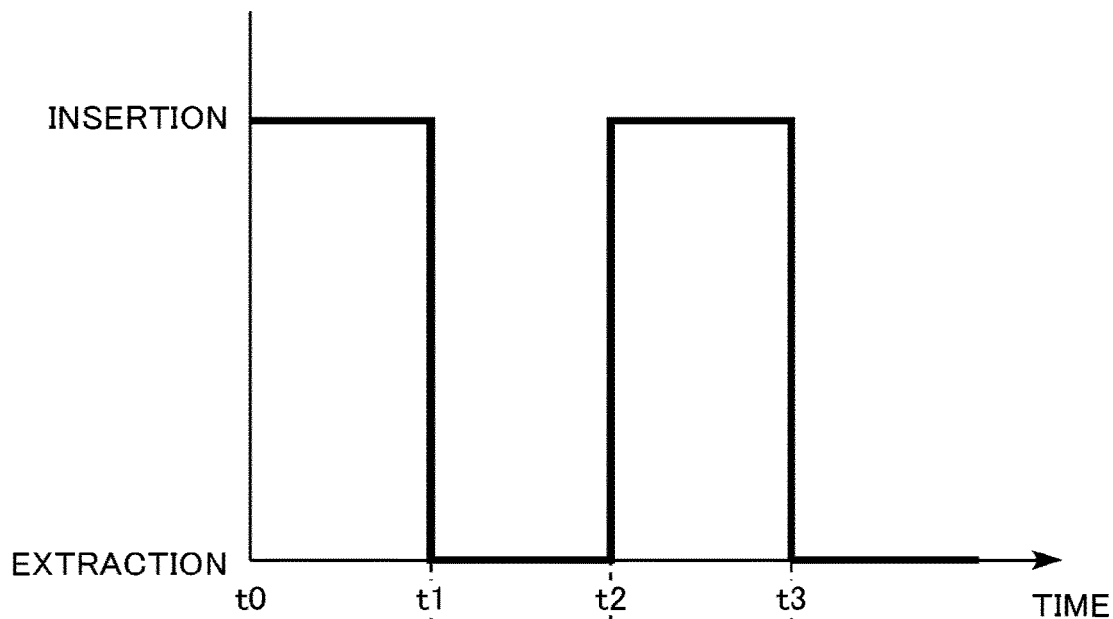
FIGS. 3A and 3B are explanatory views of operations of the multi charged particle beam writing apparatus according to the first embodiment.
Figure 3B:
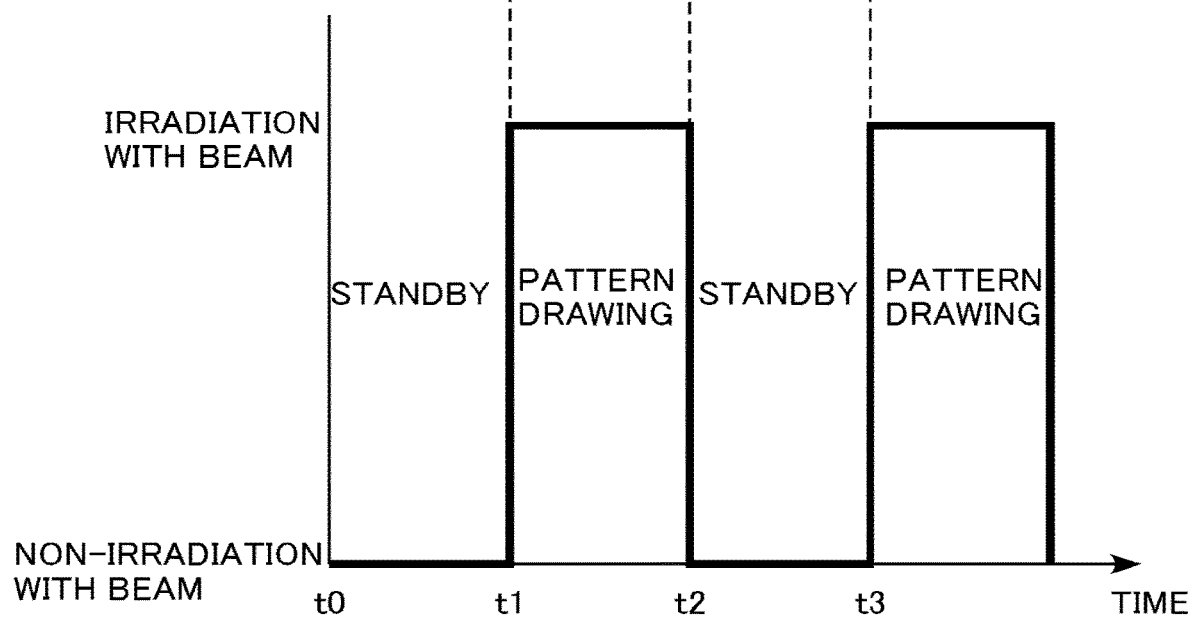

FIGS. 3A and 3B are explanatory views of the operations of the multi charged particle beam writing apparatus according to the first embodiment. FIG. 3A is a view illustrating timings for insertion and extraction of the shielding plate 31 between the shaping aperture array substrate 28 and the blanking aperture array substrate 30. FIG. 3B is a view illustrating timings of irradiation and non-irradiation of the target object 42 with the electron beam.

At the time of performing pattern drawing on the target object 42, first, the target object 42 is loaded into the pattern drawing chamber 14 and mounted on the XY stage 40.

For example, at the time t0, the shielding plate 31 is inserted between the shaping aperture array substrate 28 and the blanking aperture array substrate 30. The time t0 is a time after the target object 42 is mounted on the XY stage 40. Next, the emission of the electron beam B from the electron gun assembly 16 is started between the time t0 and the time t1.

Figure 4:
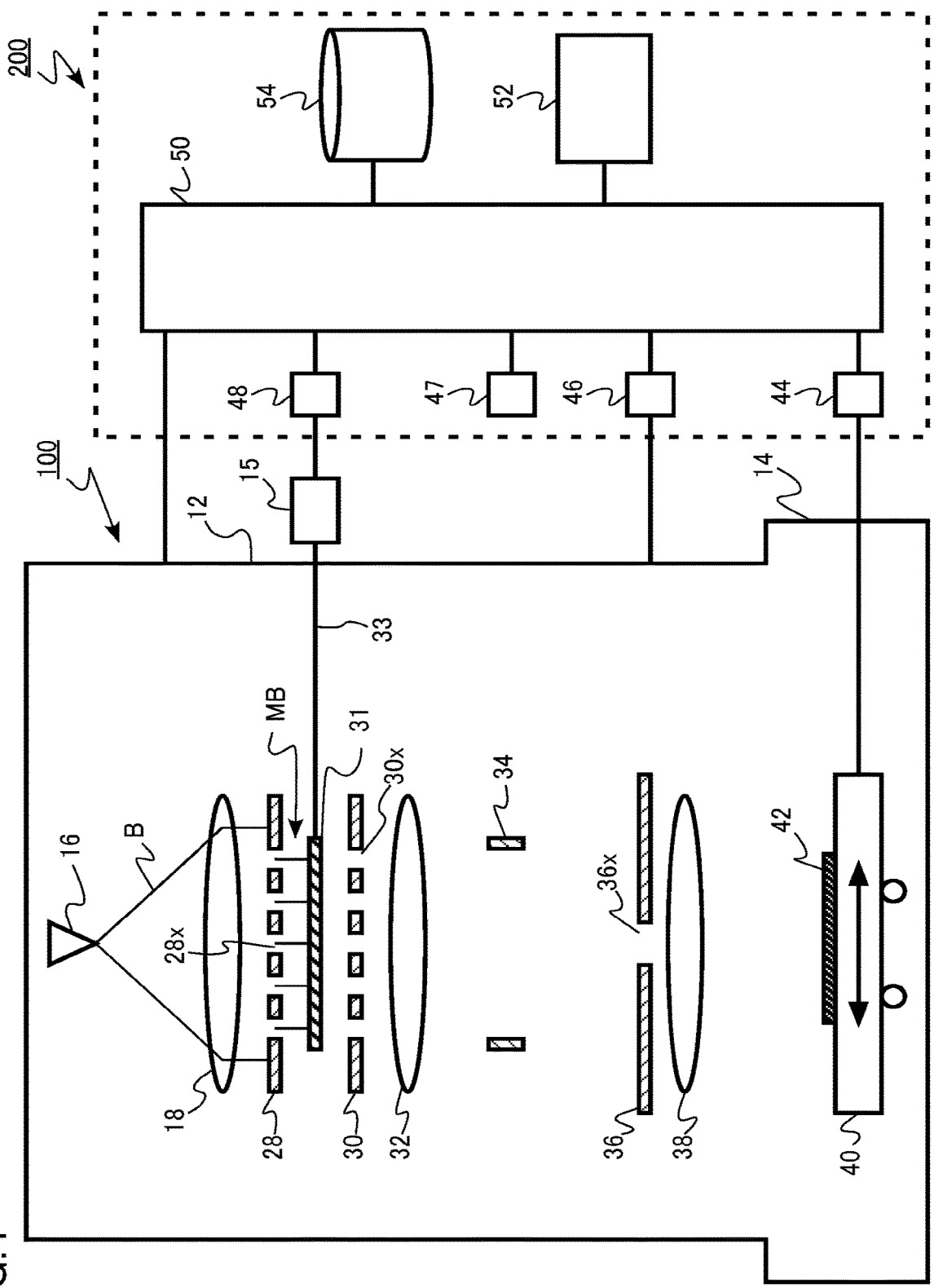
FIG. 4 is an explanatory view of operations of the multi charged particle beam writing apparatus according to the first embodiment.

FIG. 4 is an explanatory view of the operations of the multi charged particle beam writing apparatus according to the first embodiment. FIG. 4 illustrates a state in which the shielding plate 31 is inserted between the shaping aperture array substrate 28 and the blanking aperture array substrate 30.

The shaping aperture array substrate 28 is illuminated with the electron beam B emitted from the electron gun assembly 16 almost vertically by the illumination lens 18. The electron beam B with which the shaping aperture array substrate 28 is illuminated is divided while passing through the plurality of first openings 28x of the shaping aperture array substrate 28, so that the multiple beams MB are formed. The multiple beams MB are configured with a plurality of electron beams.

During the period from the time t0 to the time t1, as illustrated in FIG. 4, the multiple beams MB are shielded by the shielding plate 31, so that the target object 42 is not irradiated. During the period from the time t0 to the time t1, a standby state in which the pattern drawing on the target object 42 is not performed is maintained.

After that, at the time when it is determined that the output of the electron beam B is stabilized and the thermal expansion of the shaping aperture array substrate 28 is stabilized, the shielding plate 31 is extracted from the space between the shaping aperture array substrate 28 and the blanking aperture array substrate 30. The time corresponds to the time t1.

The determination that the output of the electron beam B is stabilized and the thermal expansion of the shaping aperture array substrate 28 is stabilized is performed by the determination circuit 47. The determination by the determination circuit 47 is performed on the basis of, for example, the elapse time from the emission of the electron beam B. For example, in a case where a predetermined time has elapsed from the emission of the electron beam B, the determination circuit 47 determines that the output of the electron beam B is stabilized and the thermal expansion of the shaping aperture array substrate 28 is stabilized.

The determination of the determination circuit 47 is transmitted to the shielding plate driving circuit 48, for example, through the control calculator 50, and the driving motor 15 is driven. By allowing the driving motor 15 to be driven, the shielding plate 31 is extracted from the space between the shaping aperture array substrate 28 and the blanking aperture array substrate 30.

At time t1, if the shielding plate 31 is extracted from the space between the shaping aperture array substrate 28 and the blanking aperture array substrate 30, as illustrated in FIG. 1, the respective multiple beams MB pass through the plurality of second openings 30x of the blanking aperture array substrate 30. For example, a portion of each beam of the multiple beams MB is deflected by a voltage applied to the blanker.

Each beam of the multiple beams MB that has passed through the blanking aperture array substrate 30 is converged by the projection lens 32 and travels toward the third opening 36x of the stopping aperture 36. Among the multiple beams MB, the electron beam deflected by the blanking aperture array substrate 30 deviates from the third opening 36x of the stopping aperture 36 and is shielded by the stopping aperture 36.

On the other hand, the electron beam not deflected by the blanking aperture array substrate 30 passes through the third opening 36x of the stopping aperture 36. The irradiation and the non-irradiation of the target object 42 with each beam are independently controlled by the blanking aperture array substrate 30 and the stopping aperture 36.

A command signal based on the pattern drawing data is transmitted from the control calculator 50 to the deflection control circuit 46. The voltage applied to each blanker of the blanking aperture array substrate 30 is controlled by the command signal from the deflection control circuit 46, and it is controlled whether or not each beam is deflected.

Each beam that has passed through the stopping aperture 36 is focused by the objective lens 38, and the target object 42 is irradiated, so that the pattern drawing on the target object 42 is performed.

By allowing each beam of the multiple beams MB to be deflected collectively by the deflector 34, a predetermined position of the target object 42 is irradiated with each beam. A command signal based on the pattern drawing data is transmitted from the control calculator 50 to the deflection control circuit 46. The electron beam is deflected by the deflector 34 on the basis of the command signal from the deflection control circuit 46, and a predetermined position on the target object 42 determined by the pattern drawing data is irradiated with the electron beam.

For example, a predetermined position on the target object 42 on the XY stage 40 that moves continuously is irradiated with the electron beam. The XY stage 40 moves on the basis of the command signal from the stage driving circuit 44. The electron beam follows the movement of the XY stage 40 by being deflected by the deflector 34.

When the pattern writing on the target object 42 is completed, the shielding plate 31 is inserted between the shaping aperture array substrate 28 and the blanking aperture array substrate 30. The time corresponds to the time t2. After the time t2, a standby state in which the pattern drawing on the target object 42 is not performed is maintained.

After the shielding plate 31 is inserted between the shaping aperture array substrate 28 and the blanking aperture array substrate 30, the emission of the electron beam B from the electron gun assembly 16 is stopped. After that, the target object 42 on which the pattern drawing has been completed is unloaded from the pattern drawing chamber 14.

Next, another target object 42 is loaded into the pattern drawing chamber 14 and mounted on the XY stage 40. Next, the emission of the electron beam B from the electron gun assembly 16 is started.

As in the case of the pattern drawing on the preceding target object 42, at the time when it is determined that the output of the electron beam B is stabilized and the thermal expansion of the shaping aperture array substrate 28 is stabilized, the shielding plate 31 is extracted from the space between the shaping aperture array substrate 28 and the blanking aperture array substrate 30. The time corresponds to the time t3.

After that, as in the case of the preceding target object 42, the pattern drawing on the target object 42 is performed.

Next, the function and effect of the charged particle beam writing apparatus according to the first embodiment will be described.

In the mask writing apparatus using the multiple beams MB, by allowing the electron beam B emitted from the electron gun assembly 16 to pass through the shaping aperture array substrate 28 having the plurality of first openings 28x, the multiple beams MB are formed. Each beam of the multiple beams MB is independently deflected by the blanking aperture array substrate 30.

The blanking aperture array substrate 30 includes a plurality of second openings 30x through which each beam of the multiple beams MB passes, an electrode pair that is provided in each opening, and an electronic circuit that controls a voltage applied to the electrode pair. By controlling the voltage applied to the electrode pair, each beam of the multiple beams MB is deflected. The beam deflected by the electrode pair is shielded, and the target object is irradiated with the electron beam that is not deflected, so that the pattern drawing is performed.

By the irradiation with the electron beam B, the temperature of the shaping aperture array substrate 28 increases. If the temperature of the shaping aperture array substrate 28 increases, the pitch of the first openings 28x changes due to the thermal expansion. If the pitch of the first openings 28x deviates from a predetermined range, there occurs a problem that, for example, each beam of the multiple beams MB cannot pass through the desired second openings 30x of the blanking aperture array substrate 30, and thus, the electron beam with which the target object 42 to be irradiated is lost.

For this reason, for example, the pitch of the first openings 28x of the shaping aperture array substrate 28 is designed in consideration of the change due to the temperature increase in advance. That is, at the time point when the pitch of the first openings 28x is stabilized by the thermal expansion of the shaping aperture array substrate 28, each beam of the multiple beams MB is designed so as to pass through each opening of the blanking aperture array substrate 30.

Therefore, there is a concern that, until the pitch of the first openings 28x of the shaping aperture array substrate 28 is stabilized, the electron beam cannot pass through each opening of the blanking aperture array substrate 30, and the electronic circuit of the blanking aperture array substrate 30 is irradiated. In addition, there is a concern that the electronic circuit of the blanking aperture array substrate 30 is irradiated with the X-rays generated by irradiating the shaping aperture array substrate 28 with the electron beam B. If the electronic circuit is irradiated with the electron beams or X-rays, there is a concern that the electronic circuit fails.

The mask writing apparatus according to the first embodiment includes the shielding plate 31 that is insertably provided between the shaping aperture array substrate 28 and the blanking aperture array substrate 30 and can shield the multiple beams MB. Until the pitch of the first openings 28x of the shaping aperture array substrate 28 is stabilized, all the multiple beams MB are simultaneously shielded by the shielding plate 31, and thus, the irradiation of the electronic circuit of the blanking aperture array substrate 30 with the electron beams is suppressed.

Therefore, the failure of the electronic circuit of the blanking aperture array substrate 30 is suppressed. Therefore, a mask writing apparatus with improved reliability is realized.

The shielding plate 31 preferably contains a metal and more preferably contains a heavy metal. By containing a metal, particularly, a heavy metal, the effect of shielding an electron beam and X-rays is improved.

From the viewpoint of avoiding the influence of the existence of the shielding plate 31 on the trajectory of the electron beam, it is preferable that the metal contained in the shielding plate 31 is a non-magnetic metal.

The thickness of the shielding plate 31 is preferably 0.5 mm or more and 5 mm or less, more preferably 1 mm or more and 3 mm or less. In a case where the thickness is larger than the above-mentioned lower limit, the ability of shielding the electron beams and the X-rays is improved. In addition, in a case where the thickness is smaller than the above-mentioned upper limit, the weight is reduced, and the support by the support portion 33 is facilitated.

From the viewpoint of shielding the multiple beams MB, it is preferable that the horizontal width a3 and the vertical width b3 of the shielding plate 31 are larger than the horizontal width a1 and the vertical width b1 of the first aperture array of the shaping aperture array substrate 28, respectively. From the same viewpoint, it is preferable that the horizontal width a3 and the vertical width b3 of the shielding plate 31 are larger than the horizontal width a2 and the vertical width b2 of the second aperture array of the blanking aperture array substrate 30, respectively.

Heretofore, in the multi charged particle beam writing apparatus according to the first embodiment, the insertable shielding plate 31 is provided between the shaping aperture array substrate 28 and the blanking aperture array substrate 30, and thus, the irradiation of the electronic circuit of the blanking aperture array substrate 30 with the charged particle beams is suppressed. Therefore, a multi charged particle beam writing apparatus with improved reliability is realized.

Second Embodiment

A multi charged particle beam writing apparatus according to a second embodiment is different from the multi charged particle beam writing apparatus according to the first embodiment in that the multi charged particle beam writing apparatus according to the second embodiment further includes a measurement device for measuring a current flowing in the shielding plate, and a determination circuit determines extraction of the shielding plate from a space between the first aperture substrate and the second aperture substrate on the basis of a measurement result of the measurement device. Hereinafter, a portion of contents overlapping with the first embodiment will be omitted in description.

Figure 5:
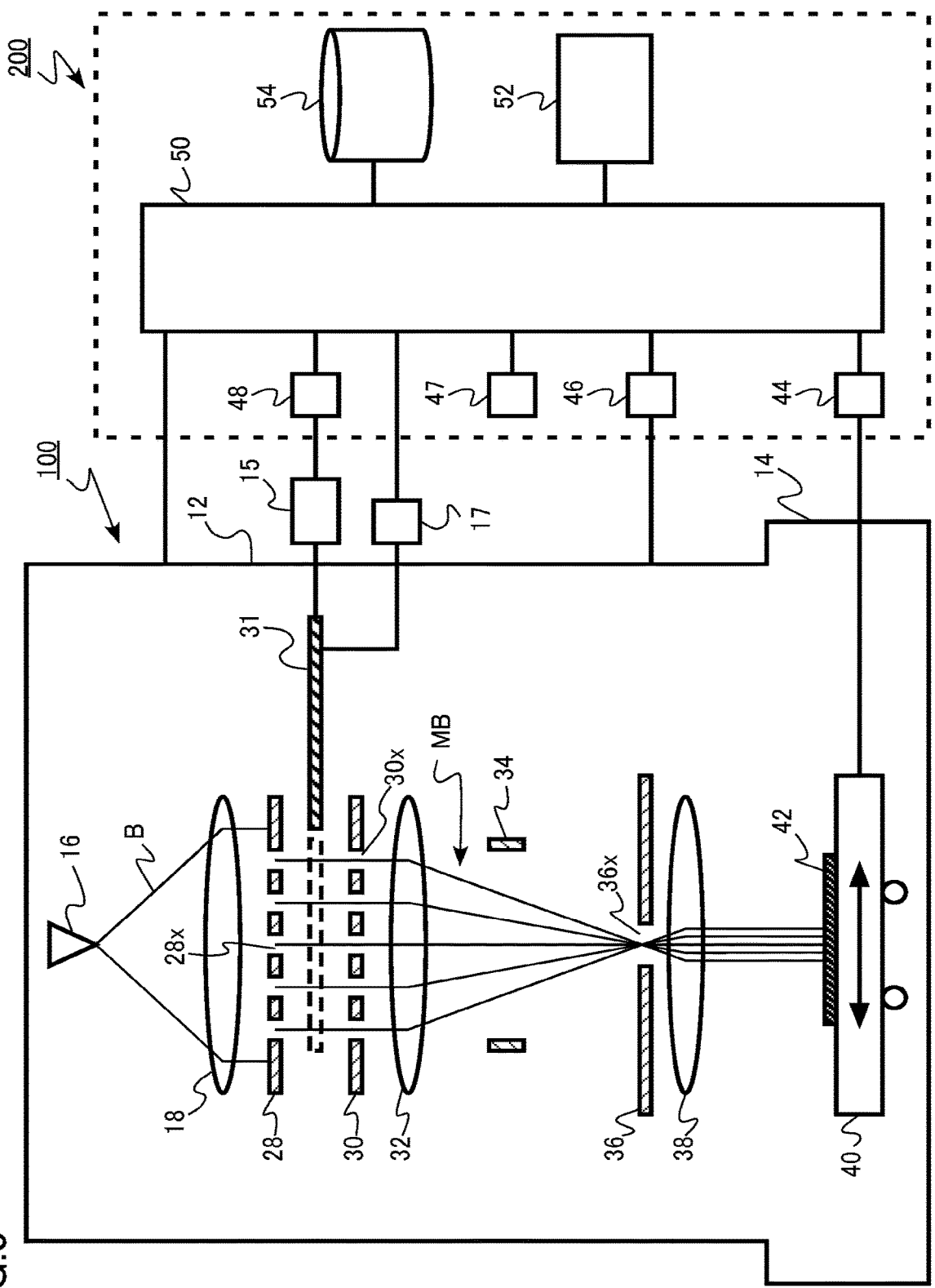
FIG. 5 is a conceptual view illustrating a configuration of a multi charged particle beam writing apparatus according to a second embodiment.

FIG. 5 is a conceptual view illustrating a configuration of a multi charged particle beam writing apparatus according to a second embodiment.

As illustrated in FIG. 5, the mask writing apparatus (charged particle beam writing apparatus) includes a pattern drawing unit 100 and a control unit 200. The mask writing apparatus draws a desired pattern on the target object 42.

The pattern drawing unit 100 includes an electron lens barrel 12, a pattern drawing chamber 14, a driving motor 15 (driving unit), and a current meter 17 (measurement device). An electron gun assembly 16 (emission unit), an illumination lens 18, a shaping aperture array substrate 28 (first aperture substrate), a blanking aperture array substrate 30 (second aperture substrate), a shielding plate 31, a projection lens 32, a support portion 33, a deflector 34, a stopping aperture 36, and an objective lens 38 are arranged in the electron lens barrel 12. The pattern drawing unit 100 performs pattern drawing on the target object 42.

An XY stage 40 movably arranged is arranged in the pattern drawing chamber 14. The target object 42 can be mounted on the XY stage 40. The target object 42 is a mask substrate for exposure for transferring a pattern to a wafer. The mask substrate is, for example, a mask blank on which nothing is drawn yet.

The control unit 200 includes a stage driving circuit 44, a deflection control circuit 46, a determination circuit 47, a shielding plate driving circuit 48, a control calculator 50, a memory 52, and a magnetic disk drive 54. The control unit 200 controls the pattern drawing unit 100 that performs pattern drawing on the target object 42.

The current meter 17 is provided outside the electron lens barrel 12. The current meter 17 is, for example, electrically connected to the shielding plate 31 through wirings. The current meter 17 can measure the current flowing by allowing the shielding plate 31 to be irradiated with the multiple beams MB.

The measurement result of the current meter 17 is transmitted to the determination circuit 47, for example, through the control calculator 50. The determination circuit 47 determines an appropriate timing for extracting the shielding plate 31 from the space between the shaping aperture array substrate 28 and the blanking aperture array substrate 30 on the basis of the measurement result of the current meter 17.

In the first embodiment, as described with reference to FIGS. 3A and 3B, when the pattern is drawn on the target object 42, the emission of the electron beam B from the electron gun assembly 16 is started between the time t0 and the time t1. Then, at the time when it is determined that the output of the electron beam B is stabilized and the thermal expansion of the shaping aperture array substrate 28 is stabilized, the shielding plate 31 is extracted from the space between the shaping aperture array substrate 28 and the blanking aperture array substrate 30. The time corresponds to the time t1.

If the shaping aperture array substrate 28 thermally expands, the opening diameter of the first opening 28x of the shaping aperture array substrate 28 also increases due to the expansion. If the opening diameter of the first opening 28x increases, the irradiation amount of the multiple beams MB which passes through the shaping aperture array substrate 28 and with which the shielding plate 31 is irradiated also increases. In other words, the current flowing in the shielding plate 31 increases.

Therefore, it is possible to determine whether the thermal expansion of the shaping aperture array substrate 28 is stabilized by measuring the current flowing in the shielding plate 31. For example, the time point when the increase in the current flowing in the shielding plate 31 stops is determined to be the time point when the thermal expansion of the shaping aperture array substrate 28 is stabilized.

The determination that the output of the electron beam B is stabilized and the thermal expansion of the shaping aperture array substrate 28 is stabilized is performed by the determination circuit 47. The determination circuit 47 determines, for example, the time point when the increase in the current value measured by the current meter 17 stops to be the time point when the output of the electron beam B is stabilized and the thermal expansion of the shaping aperture array substrate 28 is stabilized.

According to the second embodiment, by providing the current meter 17, it is possible to accurately determine the time point when the thermal expansion of the shaping aperture array substrate 28 is stabilized. Therefore, it is possible to accurately determine an appropriate timing for extracting the shielding plate 31 from the space between the shaping aperture array substrate 28 and the blanking aperture array substrate 30. Therefore, it is not necessary to provide a redundant standby time until the shielding plate 31 is extracted, so that the throughput of the mask writing apparatus is improved, and the productivity of the mask writing apparatus is improved.

From the viewpoint of reducing the resistance of the shielding plate 31 and improving the measurement accuracy of the current flowing in the shielding plate 31, it is preferable that the shielding plate 31 contains a metal. In addition, it is preferable that the shielding plate 31 is a metal plate.

Heretofore, similarly to the first embodiment, in the multi charged particle beam writing apparatus according to the second embodiment, the shielding plate 31 that can be inserted between the shaping aperture array substrate 28 and the blanking aperture array substrate 30 is provided, so that the irradiation of the electronic circuit of the blanking aperture array substrate 30 with the charged particle beam is suppressed. Furthermore, by providing the current meter 17, the throughput of the mask writing apparatus is improved, and the productivity of the mask writing apparatus is improved.

Heretofore, the embodiment has been described with reference to the specific examples. However, the embodiment is not limited to these specific examples.

In the first and second embodiments, a case where the shielding plate 31 is configured with one plate has been described as an example, but the shielding plate 31 is not limited to one plate. For example, the shielding plate 31 may be configured with a plurality of plates. For example, an iris diaphragm structure using diaphragm blades can be applied to the shielding plate 31.

In the first and second embodiments, a case where the charged particle beam writing apparatus is a mask writing apparatus has been described as an example, but the embodiments can be applied to, for example, a charged particle beam writing apparatus that directly draws a pattern on a semiconductor wafer.

In the first and second embodiments, a case where the shaping aperture array substrate 28 is illuminated with the electron beam B emitted from the electron gun assembly 16 almost vertically by the illumination lens 18 has been described as an example, but the embodiments can also be applied to a case where the shaping aperture array substrate 28 is illuminated at an angle in a direction in which the diameter of the electron beam B is reduced.

In addition, although the portions that are not directly necessary for the description of the embodiment such as the device configuration and the control method are omitted in description, the required device configuration and control method can be appropriately selected and used. For example, although the configuration of the control unit that controls the charged particle beam writing apparatus is omitted in description, it goes without saying that the required configuration of the control unit is appropriately selected and used. In addition, all charged particle beam writing apparatuses and apertures which include the elements of the embodiment and of which design can be appropriately changed by those skilled in the art are included in the scope of the embodiment.

What is claimed is:

1. A multi charged particle beam writing apparatus, comprising:
    an emission unit emitting a charged particle beam;
    a first aperture substrate having a plurality of first openings, the first aperture being irradiated with the charged particle beam, and the first aperture allowing a portion of the charged particle beam to pass through the plurality of first openings to form multiple beams;
    a second aperture substrate having a plurality of second openings through which each beam of the multiple beams passes and the second aperture substrate being capable of independently deflecting the each beam of the multiple beams; and
    a shielding plate provided so as to be insertable to a space between the first aperture substrate and the second aperture substrate and the shielding plate being capable of simultaneously shielding all the multiple beams.

2. The multi charged particle beam writing apparatus according to claim 1, further comprising a measurement device measuring a current flowing in the shielding plate.

3. The multi charged particle beam writing apparatus according to claim 2, further comprising a determination circuit determining extraction of the shielding plate from the space between the first aperture substrate and the second aperture substrate on the basis of a measurement result of the measurement device.

4. The multi charged particle beam writing apparatus according to claim 1, further comprising a driving motor performing an insertion and an extraction of the shielding plate to and from the space between the first aperture substrate and the second aperture substrate.

5. The multi charged particle beam writing apparatus according to claim 1, wherein the shielding plate contains a metal.

6. The multi charged particle beam writing apparatus according to claim 5, wherein the metal is a heavy metal.

7. The multi charged particle beam writing apparatus according to claim 5, wherein the metal is a non-magnetic metal.

8. The multi charged particle beam writing apparatus according to claim 1, wherein the first aperture substrate has a first aperture array, and a horizontal width and a vertical width of the shielding plate are larger than a horizontal width and a vertical width of the first aperture array.

9. The multi charged particle beam writing apparatus according to claim 8, wherein the second aperture substrate has a second aperture array, and the horizontal width and the vertical width of the shielding plate are larger than a horizontal width and a vertical width of the second aperture array.

10. The multi charged particle beam writing apparatus according to claim 1, wherein a thickness of the shielding plate is 0.5 mm or more and 5 mm or less.

11. The multi charged particle beam writing apparatus according to claim 1, wherein the charged particle beam is an electron beam.

\* \* \* \* \*